(12) United States Patent
Kim et al.

(10) Patent No.: US 9,704,725 B1
(45) Date of Patent: Jul. 11, 2017

(54) SEMICONDUCTOR DEVICE WITH LEADFRAME CONFIGURED TO FACILITATE REDUCED BURR FORMATION

(75) Inventors: Hyun Jun Kim, Seoul (KR); Hyung Kook Chung, Seoul (KR); Hong Bae Kim, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 986 days.

(21) Appl. No.: 13/412,848

(22) Filed: Mar. 6, 2012

(51) Int. Cl.
*H01L 23/495* (2006.01)
*H01L 21/48* (2006.01)
(Continued)

(52) U.S. Cl.
CPC ........ *H01L 21/4842* (2013.01); *H01L 21/561* (2013.01); *H01L 23/3107* (2013.01); *H01L 23/49548* (2013.01); *H01L 24/49* (2013.01); H01L 24/48 (2013.01); H01L 24/73 (2013.01); H01L 2224/05554 (2013.01); H01L 2224/32245 (2013.01); H01L 2224/48091 (2013.01); H01L 2224/48247 (2013.01); H01L 2224/48465 (2013.01); H01L 2224/49433 (2013.01); H01L 2224/73265 (2013.01); H01L 2224/92247 (2013.01); H01L 2924/00014 (2013.01);
(Continued)

(58) Field of Classification Search
USPC ........ 257/666, 669, 674, 676, 692, 698, 730
See application file for complete search history.

(56) References Cited

U.S. PATENT DOCUMENTS

| 2,596,993 A | 5/1952 | Gookin |
| 3,435,815 A | 4/1969 | Forcier |
| (Continued) | | |

FOREIGN PATENT DOCUMENTS

| DE | 19734794 A1 | 8/1997 |
| EP | 0393997 | 10/1990 |
| (Continued) | | |

OTHER PUBLICATIONS

National Semiconductor Corporation, "Leadless Leadframe Package," Informational Pamphlet from webpage, 21 pages, Oct. 2002, www.national.com.
(Continued)

*Primary Examiner* — Cory Eskridge
(74) *Attorney, Agent, or Firm* — Kevin B. Jackson

(57) ABSTRACT

A semiconductor package or device including a uniquely configured leadframe defining a plurality of leads which are arranged and partially etched in a manner facilitating a substantial reduction in burr formation resulting from a saw singulation process used to complete the fabrication of the semiconductor device. The semiconductor device includes a die pad defining multiple peripheral edge segments. In addition, the semiconductor device includes a plurality of leads which are provided in a prescribed arrangement. Connected to the top surface of the die pad is at least one semiconductor die which is electrically connected to at least some of the leads. At least portions of the die pad, the leads, the lands, and the semiconductor die are encapsulated by the package body, with at least portions of the bottom surfaces of the die pad and the leads being exposed in a common exterior surface of the package body.

18 Claims, 10 Drawing Sheets

(51) Int. Cl.
 *H01L 23/31* (2006.01)
 *H01L 23/00* (2006.01)
 *H01L 21/56* (2006.01)

(52) U.S. Cl.
 CPC .............. *H01L 2924/014* (2013.01); *H01L 2924/01027* (2013.01); *H01L 2924/01029* (2013.01); *H01L 2924/01033* (2013.01); *H01L 2924/01047* (2013.01); *H01L 2924/01078* (2013.01); *H01L 2924/01082* (2013.01); *H01L 2924/14* (2013.01); *H01L 2924/15747* (2013.01); *H01L 2924/181* (2013.01); *H01L 2924/19041* (2013.01); *H01L 2924/19043* (2013.01); *H01L 2924/351* (2013.01)

(56) References Cited

U.S. PATENT DOCUMENTS

| | | | |
|---|---|---|---|
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,221,925 | A | 9/1980 | Finley et al. |
| 4,258,381 | A | 3/1981 | Inaba et al. |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe et al. |
| 4,451,224 | A | 5/1984 | Harding et al. |
| 4,530,152 | A | 7/1985 | Roche et al. |
| 4,541,003 | A | 9/1985 | Otsuka et al. |
| 4,646,710 | A | 3/1987 | Schmid et al. |
| 4,707,724 | A | 11/1987 | Suzuki et al. |
| 4,727,633 | A | 3/1988 | Herrick et al. |
| 4,737,839 | A | 4/1988 | Burt et al. |
| 4,756,080 | A | 7/1988 | Thorp et al. |
| 4,812,896 | A | 3/1989 | Rothgery |
| 4,862,245 | A | 8/1989 | Pashby et al. |
| 4,862,246 | A | 8/1989 | Masuda et al. |
| 4,907,067 | A | 3/1990 | Derryberry et al. |
| 4,920,074 | A | 4/1990 | Shimizu et al. |
| 4,935,803 | A | 6/1990 | Kalfus et al. |
| 4,942,454 | A | 7/1990 | Mori et al. |
| 4,987,475 | A | 1/1991 | Schlesinger et al. |
| 5,018,003 | A | 5/1991 | Yasunaga et al. |
| 5,029,386 | A | 7/1991 | Chao et al. |
| 5,041,902 | A | 8/1991 | McShane et al. |
| 5,057,900 | A | 10/1991 | Yamazaki et al. |
| 5,059,379 | A | 10/1991 | Tsutsumi et al. |
| 5,065,223 | A | 11/1991 | Matsuki et al. |
| 5,070,039 | A | 12/1991 | Johnson et al. |
| 5,087,961 | A | 2/1992 | Long et al. |
| 5,091,341 | A | 2/1992 | Asada et al. |
| 5,096,852 | A | 3/1992 | Hobson et al. |
| 5,118,298 | A | 6/1992 | Murphy |
| 5,122,860 | A | 6/1992 | Kikuchi et al. |
| 5,134,773 | A | 8/1992 | LeMaire et al. |
| 5,151,039 | A | 9/1992 | Murphy |
| 5,157,475 | A | 10/1992 | Yamaguchi et al. |
| 5,157,480 | A | 10/1992 | McShane et al. |
| 5,168,368 | A | 12/1992 | Gow et al. |
| 5,172,213 | A | 12/1992 | Zimmerman et al. |
| 5,172,214 | A | 12/1992 | Casto et al. |
| 5,175,060 | A | 12/1992 | Enomoto et al. |
| 5,200,362 | A | 4/1993 | Lin et al. |
| 5,200,809 | A | 4/1993 | Kwon et al. |
| 5,214,845 | A | 6/1993 | King et al. |
| 5,216,278 | A | 6/1993 | Lin et al. |
| 5,218,231 | A | 6/1993 | Kudo et al. |
| 5,221,642 | A | 6/1993 | Burns et al. |
| 5,250,841 | A | 10/1993 | Sloan et al. |
| 5,252,853 | A | 10/1993 | Michii et al. |
| 5,258,094 | A | 11/1993 | Furui et al. |
| 5,266,834 | A | 11/1993 | Nishi et al. |
| 5,273,938 | A | 12/1993 | Lin et al. |
| 5,277,972 | A | 1/1994 | Sakumoto |
| 5,278,446 | A | 1/1994 | Nagaraj et al. |
| 5,279,029 | A | 1/1994 | Burns et al. |
| 5,281,849 | A | 1/1994 | Singh Deo et al. |
| 5,285,352 | A | 2/1994 | Pastore et al. |
| 5,294,897 | A | 3/1994 | Notani et al. |
| 5,327,008 | A | 7/1994 | Djennas et al. |
| 5,332,864 | A | 7/1994 | Liang et al. |
| 5,335,771 | A | 8/1994 | Murphy et al. |
| 5,336,931 | A | 8/1994 | Juskey et al. |
| 5,343,076 | A | 8/1994 | Katayama et al. |
| 5,358,905 | A | 10/1994 | Chiu et al. |
| 5,365,106 | A | 11/1994 | Watanabe et al. |
| 5,381,042 | A | 1/1995 | Lerner et al. |
| 5,391,439 | A | 2/1995 | Tomita et al. |
| 5,406,124 | A | 4/1995 | Morita et al. |
| 5,410,180 | A | 4/1995 | Fujii et al. |
| 5,414,299 | A | 5/1995 | Wang et al. |
| 5,417,905 | A | 5/1995 | Lemaire et al. |
| 5,424,576 | A | 6/1995 | Djennas et al. |
| 5,428,248 | A | 6/1995 | Cha et al. |
| 5,435,057 | A | 7/1995 | Bindra et al. |
| 5,444,301 | A | 8/1995 | Song et al. |
| 5,452,511 | A | 9/1995 | Chang |
| 5,454,905 | A | 10/1995 | Fogelson |
| 5,467,032 | A | 11/1995 | Lee |
| 5,474,958 | A | 12/1995 | Djennas et al. |
| 5,484,274 | A | 1/1996 | Neu et al. |
| 5,493,151 | A | 2/1996 | Asada et al. |
| 5,508,556 | A | 4/1996 | Lin et al. |
| 5,517,056 | A | 5/1996 | Bigler et al. |
| 5,521,429 | A | 5/1996 | Aono et al. |
| 5,528,076 | A | 6/1996 | Pavio et al. |
| 5,534,467 | A | 7/1996 | Rostoker et al. |
| 5,539,251 | A | 7/1996 | Iverson et al. |
| 5,543,657 | A | 8/1996 | Diffenderfer et al. |
| 5,544,412 | A | 8/1996 | Romero et al. |
| 5,545,923 | A | 8/1996 | Barber et al. |
| 5,581,122 | A | 12/1996 | Chao et al. |
| 5,592,019 | A | 1/1997 | Ueda et al. |
| 5,592,025 | A | 1/1997 | Clark et al. |
| 5,594,274 | A | 1/1997 | Suetaki et al. |
| 5,595,934 | A | 1/1997 | Kim et al. |
| 5,604,376 | A | 2/1997 | Hamburgen et al. |
| 5,608,265 | A | 3/1997 | Kitano et al. |
| 5,608,267 | A | 3/1997 | Mahulikar et al. |
| 5,625,222 | A | 4/1997 | Yoneda et al. |
| 5,633,528 | A | 5/1997 | Abbott |
| 5,637,922 | A | 6/1997 | Fillion et al. |
| 5,639,990 | A | 6/1997 | Nishihara et al. |
| 5,640,047 | A | 6/1997 | Nakashima et al. |
| 5,641,997 | A | 6/1997 | Ohta et al. |
| 5,643,433 | A | 7/1997 | Fukase et al. |
| 5,644,169 | A | 7/1997 | Chun et al. |
| 5,646,831 | A | 7/1997 | Manteghi et al. |
| 5,650,663 | A | 7/1997 | Parthasarathi et al. |
| 5,661,088 | A | 8/1997 | Tessier et al. |
| 5,665,996 | A | 9/1997 | Williams et al. |
| 5,673,479 | A | 10/1997 | Hawthorne et al. |
| 5,683,806 | A | 11/1997 | Sakumoto et al. |
| 5,683,943 | A | 11/1997 | Yamada et al. |
| 5,689,135 | A | 11/1997 | Ball et al. |
| 5,696,666 | A | 12/1997 | Miles et al. |
| 5,701,034 | A | 12/1997 | Marrs et al. |
| 5,703,407 | A | 12/1997 | Hori et al. |
| 5,710,064 | A | 1/1998 | Song et al. |
| 5,723,899 | A | 3/1998 | Shin et al. |
| 5,724,233 | A | 3/1998 | Honda et al. |
| 5,726,493 | A | 3/1998 | Yamashita et al. |
| 5,736,432 | A | 4/1998 | MacKessy et al. |
| 5,745,984 | A | 5/1998 | Cole et al. |
| 5,753,532 | A | 5/1998 | Sim et al. |
| 5,753,977 | A | 5/1998 | Kusaka et al. |
| 5,766,972 | A | 6/1998 | Takahashi et al. |
| 5,767,566 | A | 6/1998 | Suda et al. |
| 5,770,888 | A | 6/1998 | Song et al. |
| 5,776,798 | A | 7/1998 | Quan et al. |
| 5,783,861 | A | 7/1998 | Son et al. |
| 5,801,440 | A | 9/1998 | Chu et al. |

(56) References Cited

U.S. PATENT DOCUMENTS

| | | |
|---|---|---|
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis |
| 5,817,540 A | 10/1998 | Wark |
| 5,818,105 A | 10/1998 | Kouda et al. |
| 5,821,457 A | 10/1998 | Mosley et al. |
| 5,821,615 A | 10/1998 | Lee et al. |
| 5,834,830 A | 11/1998 | Cho et al. |
| 5,835,988 A | 11/1998 | Ishii et al. |
| 5,844,306 A | 12/1998 | Fujita et al. |
| 5,854,511 A | 12/1998 | Shin et al. |
| 5,854,512 A | 12/1998 | Manteghi et al. |
| 5,856,911 A | 1/1999 | Riley et al. |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer et al. |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi et al. |
| 6,143,981 A | 11/2000 | Glenn et al. |
| 6,150,709 A | 11/2000 | Shin et al. |
| 6,166,430 A | 12/2000 | Yamaguchi |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,238,952 B1 | 5/2001 | Lin |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,281,568 B1 | 8/2001 | Glenn et al. |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,465,883 B2 | 10/2002 | Olofsson et al. |
| 6,472,735 B2 | 10/2002 | Isaak |
| 6,475,646 B2 | 11/2002 | Park et al. |
| 6,476,469 B2 | 11/2002 | Hung et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori |
| 6,495,909 B2 | 12/2002 | Jung et al. |
| 6,498,099 B1 | 12/2002 | McLellan et al. |
| 6,498,392 B2 | 12/2002 | Azuma |
| 6,501,165 B1 | 12/2002 | Farnworth et al. |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 | 9/2003 | Foster |
| 6,646,339 B1 | 11/2003 | Ku et al. |
| 6,667,546 B2 | 12/2003 | Huang et al. |
| 6,677,663 B1 | 1/2004 | Ku et al. |
| 6,686,649 B1 | 2/2004 | Mathews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,818,973 B1 | 11/2004 | Foster |
| 6,838,761 B2 | 1/2005 | Karnezos |
| 6,858,919 B2 | 2/2005 | Seo et al. |
| 6,861,288 B2 | 3/2005 | Shim et al. |
| 6,867,492 B2 | 3/2005 | Auburger et al. |
| 6,876,068 B1 | 4/2005 | Lee et al. |

(56) References Cited

U.S. PATENT DOCUMENTS

| | | |
|---|---|---|
| 6,878,571 B2 | 4/2005 | Isaak et al. |
| 6,897,552 B2 | 5/2005 | Nakao |
| 6,906,416 B2 | 6/2005 | Karnezos |
| 6,927,478 B2 | 8/2005 | Paek |
| 6,933,598 B2 | 8/2005 | Karnezos |
| 6,946,323 B1 | 9/2005 | Heo |
| 6,967,125 B2 | 11/2005 | Fee et al. |
| 6,972,481 B2 | 12/2005 | Karnezos |
| 6,995,459 B2 | 2/2006 | Lee et al. |
| 7,002,805 B2 | 2/2006 | Lee et al. |
| 7,005,327 B2 | 2/2006 | Kung et al. |
| 7,015,571 B2 | 3/2006 | Chang et al. |
| 7,034,387 B2 | 4/2006 | Karnezos |
| 7,045,396 B2 | 5/2006 | Crowley et al. |
| 7,045,887 B2 | 5/2006 | Karnezos |
| 7,049,691 B2 | 5/2006 | Karnezos |
| 7,053,469 B2 | 5/2006 | Koh et al. |
| 7,053,476 B2 | 5/2006 | Karnezos |
| 7,053,477 B2 | 5/2006 | Karnezos et al. |
| 7,057,269 B2 | 6/2006 | Karnezos |
| 7,061,088 B2 | 6/2006 | Karnezos |
| 7,064,426 B2 | 6/2006 | Karnezos |
| 7,075,816 B2 | 7/2006 | Fee et al. |
| 7,101,731 B2 | 9/2006 | Karnezos |
| 7,102,209 B1 | 9/2006 | Bayan et al. |
| 7,109,572 B2 | 9/2006 | Fee et al. |
| 7,166,494 B2 | 1/2007 | Karnezos |
| 7,169,642 B2 | 1/2007 | Karnezos |
| 7,185,426 B1 | 3/2007 | Hiner et al. |
| 7,193,298 B2 | 3/2007 | Hong et al. |
| 7,202,554 B1 | 4/2007 | Kim et al. |
| 7,205,647 B2 | 4/2007 | Karnezos |
| 7,211,471 B1 | 5/2007 | Foster |
| 7,245,007 B1 | 7/2007 | Foster |
| 7,247,519 B2 | 7/2007 | Karnezos et al. |
| 7,253,503 B1 | 8/2007 | Fusaro et al. |
| 7,253,511 B2 | 8/2007 | Karnezos et al. |
| 7,271,496 B2 | 9/2007 | Kim |
| 7,279,361 B2 | 10/2007 | Karnezos |
| 7,288,434 B2 | 10/2007 | Karnezos |
| 7,288,835 B2 | 10/2007 | Yim et al. |
| 7,298,037 B2 | 11/2007 | Yim et al. |
| 7,298,038 B2 | 11/2007 | Filoteo, Jr. et al. |
| 7,306,973 B2 | 12/2007 | Karnezos |
| 7,312,519 B2 | 12/2007 | Song et al. |
| 7,375,416 B2 * | 5/2008 | Retuta et al. ........... 257/666 |
| 7,982,298 B1 | 7/2011 | Kang et al. |
| 8,106,495 B2 | 1/2012 | Kajiki |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0001244 A1 * | 1/2003 | Araki et al. ........... 257/666 |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0080025 A1 | 4/2004 | Kasahara et al. |
| 2004/0089926 A1 | 5/2004 | Hsu et al. |
| 2004/0164387 A1 | 8/2004 | Ikenaga et al. |
| 2004/0253803 A1 | 12/2004 | Tomono et al. |
| 2005/0184377 A1 | 8/2005 | Takeuchi et al. |
| 2006/0087020 A1 | 4/2006 | Hirano et al. |
| 2006/0157843 A1 | 7/2006 | Hwang |
| 2006/0231928 A1 | 10/2006 | Dotta et al. |
| 2006/0231939 A1 | 10/2006 | Kawabata et al. |
| 2007/0023202 A1 | 2/2007 | Shibata et al. |
| 2007/0152313 A1 | 7/2007 | Periaman et al. |
| 2008/0142941 A1 | 6/2008 | Yew et al. |
| 2008/0230887 A1 | 9/2008 | Sun et al. |
| 2008/0272465 A1 | 11/2008 | Do et al. |
| 2009/0014851 A1 * | 1/2009 | Choi et al. ........... 257/676 |
| 2009/0057918 A1 | 3/2009 | Kim |

FOREIGN PATENT DOCUMENTS

| | | |
|---|---|---|
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |

(56) References Cited

FOREIGN PATENT DOCUMENTS

| | | |
|---|---|---|
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | EP0936671 | 8/1999 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

\* cited by examiner

US 9,704,725 B1

SEMICONDUCTOR DEVICE WITH LEADFRAME CONFIGURED TO FACILITATE REDUCED BURR FORMATION

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to an increased capacity semiconductor device or package which includes a leadframe defining a plurality of leads which are arranged and partially etched in a manner facilitating a substantial reduction in burr formation resulting from a saw singulation process used to complete the fabrication of the semiconductor device.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe may extend externally from the package body or may be partially exposed therein for use in electrically connecting the package to another component. In certain semiconductor packages, a portion of the die pad of the leadframe also remains exposed within the package body.

Leadframes for semiconductor devices or packages can be largely classified into copper-based leadframes (copper/iron/phosphorous; 99.8/0.01/0.025), copper alloy-based leadframes (copper/chromium/tin/zinc; 99.0/0.25/0.22), and alloy 42-based leadframes (iron/nickel; 58.0/42.0) according to the composition of the elements or materials included in the leadframe. Exemplary semiconductor devices employing leadframes include a through-hole mounting dual type inline package (DIP), a surface mounting type quad flat package (QFP), and a small outline package (SOP). The aforementioned semiconductor devices are particularly advantageous for their smaller size and superior electrical performance.

Leadframe based semiconductor devices such as those described above are typically fabricated using techniques wherein material removal processes such as sawing or punching are used to effectively electrically isolate various leads of the individual leadframe within the semiconductor device from each other and further to separate multiple leadframes within a matrix-type array from each other. However, such sawing or punching process often results in undesirable burr formation on the individual leads of each semiconductor device. In those semiconductor devices wherein the pitch between the adjacent leads is small, such burrs could have the effect of electrically shorting certain leads to each other. To prevent this occurrence, post-treatment is necessarily performed to remove the burrs after completing the manufacturing process. However, the need to complete such post-treatment process increases the manufacturing cost, and may further degrade the reliability of the device. The present invention addresses this issue by providing a semiconductor device which includes a leadframe defining a plurality of leads which are arranged and partially etched in a manner facilitating a substantial reduction in burr formation resulting from a saw singulation process used to complete the fabrication of the semiconductor device. These, as well as other features and attributes of the present invention will be discussed in more detail below.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 4A:
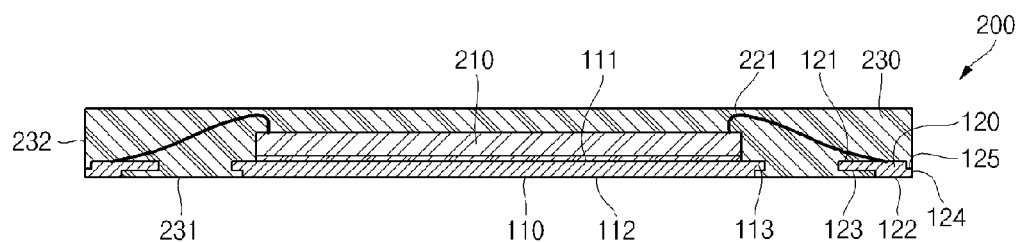
FIGS. 4A and 4B are cross-sectional views of a semiconductor device of the present invention as fabricated to include the leadframe shown in FIGS. 1A and 1B subsequent to the singulation thereof.
Figure 4B:
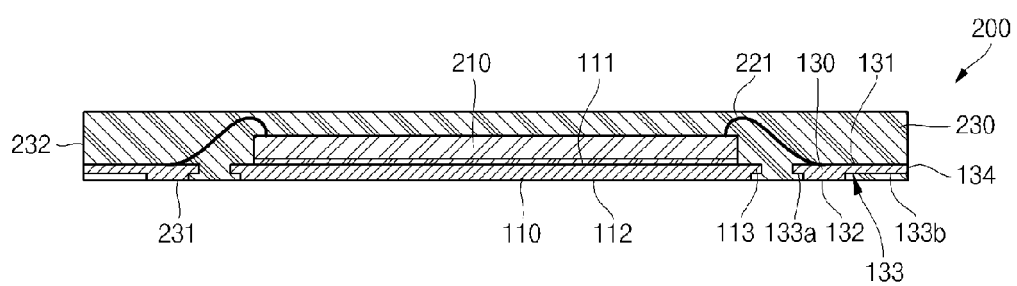

Referring now to the drawings wherein the showings are for purposes of illustrating preferred embodiments of the present invention only, and not for purposes of limiting the same, FIGS. 4A and 4B depict a semiconductor package or device 200 constructed in accordance with the present invention. The leadframe 100 integrated into the semiconductor package 200 is shown in its unsingulated state in FIGS. 1A and 1B.

Figure 1A:
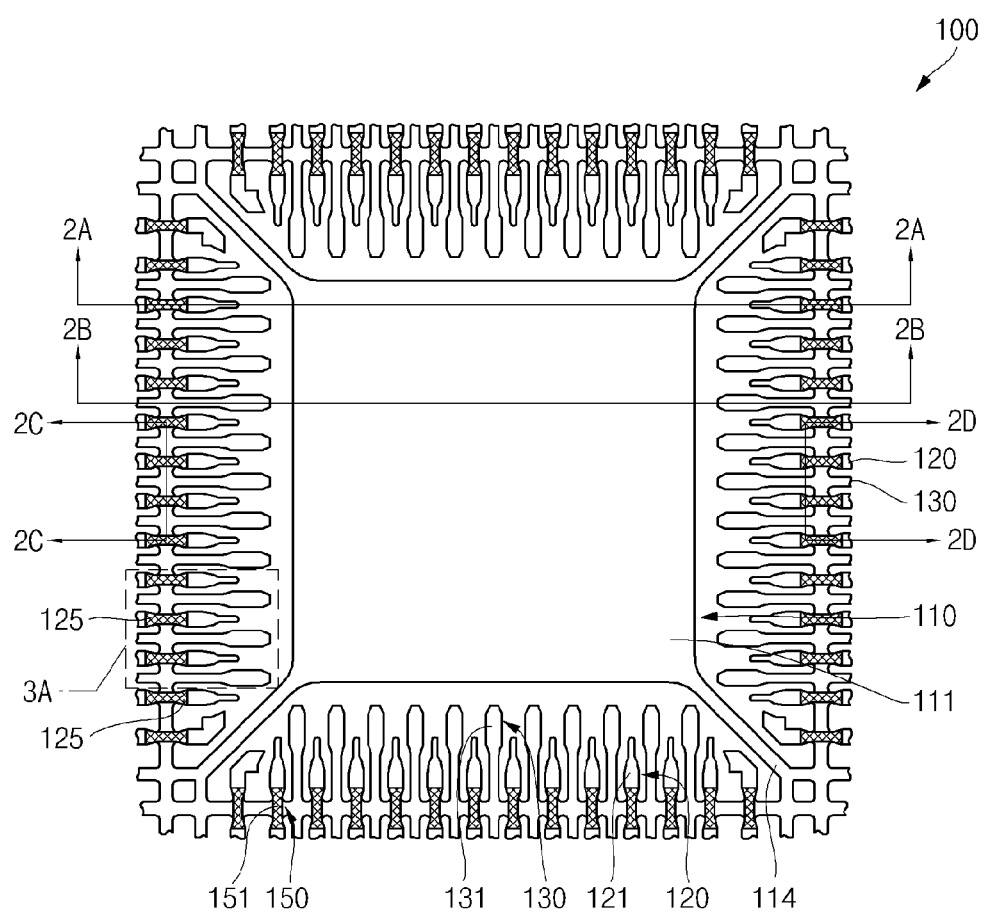
FIG. 1A is a top plan view of an unsingulated leadframe which is integrated into a semiconductor device or package constructed in accordance with the present invention.
Figure 1B:
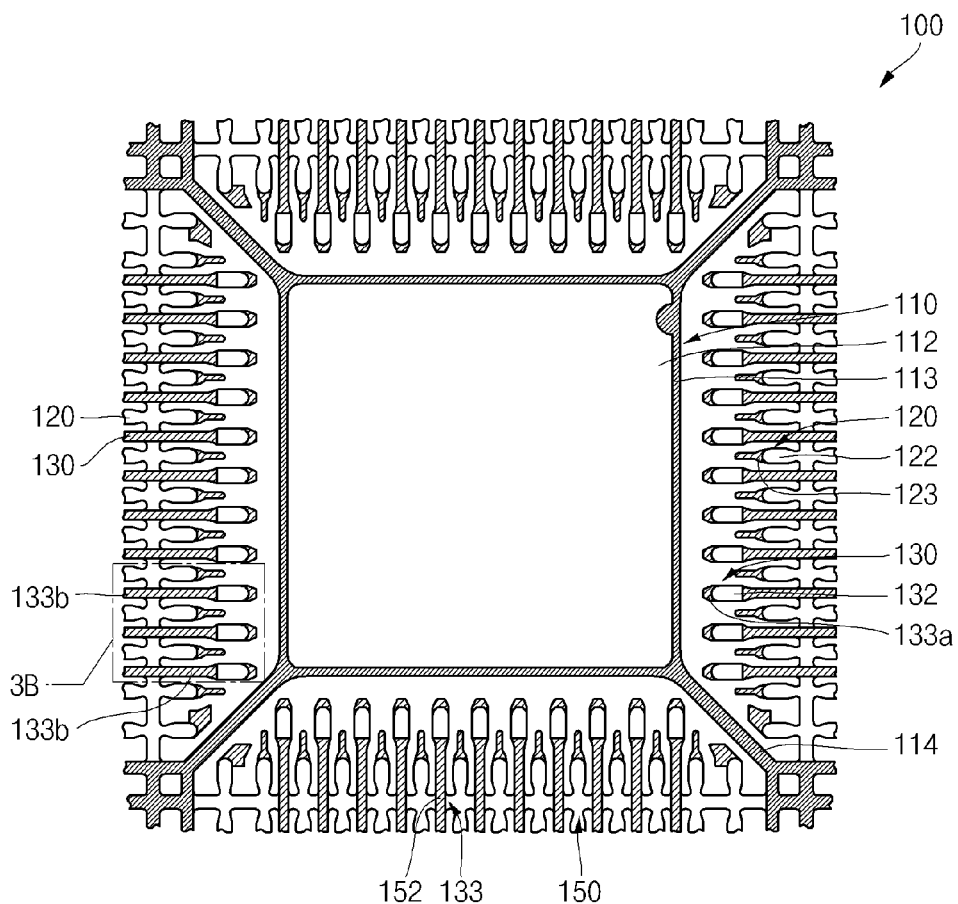
FIG. 1B is a bottom plan view of an unsingulated leadframe shown in FIG. 1A.
Figure 2A:
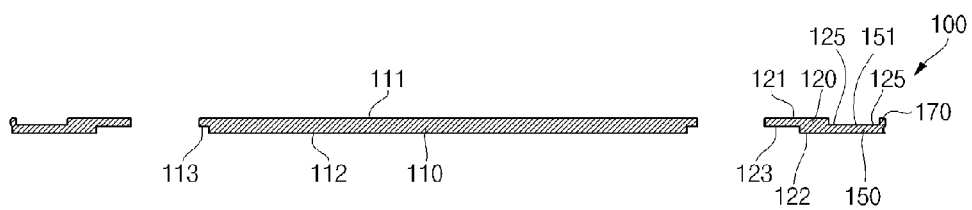
FIG. 2A is a cross-sectional view of the leadframe taken along line 2A-2A of FIG. 1A.
Figure 2B:
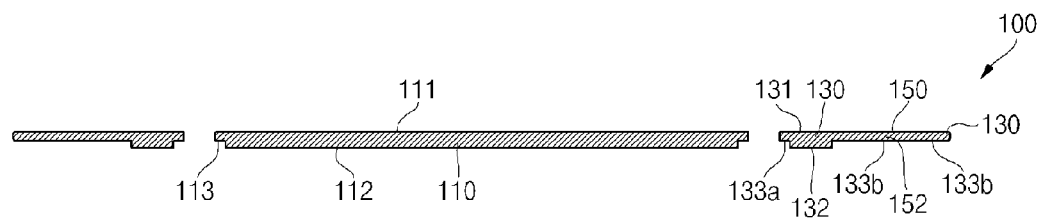
FIG. 2B is a cross-sectional view of the leadframe taken along line 2B-2B of FIG. 1A.

Referring now to FIGS. 1A-1B, 2A-2D, and 3A-3B, the leadframe 100 comprises a generally quadrangular (e.g., square) die paddle or die pad 110 which defines four peripheral edge segments. Additionally, the die pad 110 defines opposed, generally planar top and bottom surfaces 111, 112. As seen in FIGS. 2A and 2B, the die pad 110 of the leadframe 100 is not of uniform thickness. Rather, a peripheral portion of the bottom surface 112 of the die pad 110 is partially etched (e.g., half-etched) to define an etched surface 113. More particularly, the etched surface 113, which is recessed relative to the remainder of the bottom surface 112 of the die pad 110, is segregated into four segments, with each of these segments extending along a respective one of peripheral edge segments of the die pad 110 and between a respective pair of tie bars 114 of the leadframe 100 which are described in more detail below. In FIG. 1B, which is a bottom plan view of the leadframe 100, the etched surface 113 in the bottom surface 112 of the die pad 110 is indicated by the condensed hatching which slopes downwardly from right to left.

As will be discussed in more detail below, in the fabrication process for the semiconductor device 200 including the leadfame 100, a semiconductor die is attached to the top surface 111 of the die pad 110 through the use of an adhesive layer, with an encapsulant material thereafter being applied to the semiconductor die and the leadframe 100 to form the package body of the semiconductor device 200. Advantageously, the etched surface 113 formed in the peripheral portion of the bottom surface 112 of the die pad 110 as indicated above effectively increases the distance along which moisture must travel to reach the semiconductor die mounted to the top surface 111 of the die pad 110. As a result, such semiconductor die is safely protected against moisture in the completed semiconductor device 200. Additionally, the flow of encapsulant material over the etched surface 113 during the formation of the package body of the semiconductor device 200 facilitates the creation of a mechanical interlock between the package body and the die pad 110.

As indicated above, integrally connected to the die pad 110 are a plurality of tie bars 114. More particularly, the leadframe 100 includes four tie bars 114 which extend diagonally from respective ones of the four corner regions defined by the die pad 110. As seen in FIGS. 1A and 1B, the tie bars 120 are integrally connected to a generally quadrangular frame or dambar 150 which circumvents the die pad 110 and is disposed in spaced relation thereto. The tie bars 114 are identically configured to each other, and extend diagonally outwardly at predetermined lengths from respective ones of the corner regions of the die pad 110, with the integral connection of the tie bars 120 to the dambar 150 effectively supporting the die pad 110 within the interior of the dambar 150. However, as is apparent from FIGS. 1A and 1B, each of the tie bars 114 does not have an uninterrupted, linear configuration. Rather, each of the tie bars 114 defines a generally straight or linear inner portion which is integrally connected to and extends from a respective corner region of the die pad 110. The inner portion transitions into an angled pair of outer portions which are each integrally connected to the dambar 150.

As further shown in FIG. 1A, each of the tie bars 114 defines a generally planar top surface which extends in generally co-planar relation to the top surface 111 of the die pad 110. However, as shown in FIG. 1B, each tie bar 114 further defines an etched bottom surface which extends along the entire length of the inner and outer portions thereof. The etched bottom surface of each tie bar 114 extends in generally co-planar relation to the etched surface 113 of the die pad 110. In FIG. 1B, the etched bottom surface of each tie bar 114 is indicated by the condensed hatching which slopes downwardly from right to left. During the fabrication process for the semiconductor device 200 including the leadframe 100, the encapsulant material used to form the package body of the semiconductor device 200 is also able to flow over the etched bottom surfaces of the tie bars 114, thus resulting in the tie bars 114 being encapsulated by the package body of the semiconductor device 200 which enhances the bonding or mechanical interlock therebetween.

As indicated above, the tie bars 114 are integrally connected to the dambar 150 which circumvents the die pad 110. In the leadframe 100, the dambar 150 is provided in the form of a substantially quadrangular (e.g., square) ring which interconnects the distal outer portions of the tie bars 114. As best seen in FIGS. 1A and 1B, the dambar 150 defines four peripheral segments which extend in spaced, generally parallel relation to respective ones of the peripheral edge segments of the die pad 110. In a fabrication process for the semiconductor package 200 which will be described in more detail below, the dambar 150 is singulated or removed from the leadframe 100 to electrically isolate other structural features of the leadframe 100 from each other.

The leadframe 100 further comprises a plurality of first leads 120. The first leads 120 are preferably segregated into four (4) sets, with each set of the first leads 120 extending generally perpendicularly from a corresponding one of the peripheral segments of the dambar 150 toward a respective one of the peripheral edge segments of the die pad 110. Each of the first leads 120 is sized such that the inner, distal end thereof is spaced a predetermined distance from the corresponding peripheral edge segment of the die pad 110. From the perspectives shown in FIGS. 1A and 1B, each of the first leads 120 includes a generally planar first or top surface 121 and an opposed, generally planar second or bottom surface 122.

Figure 3A:
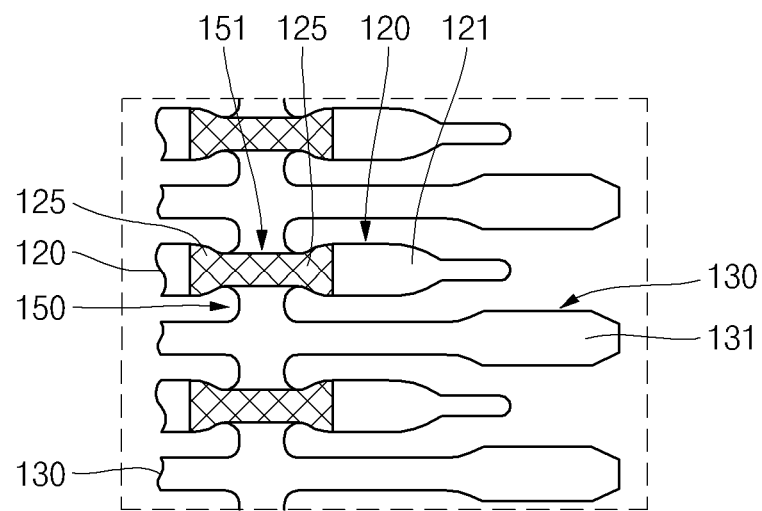
FIG. 3A is an enlargement of the region 3A shown in FIG. 1A.
Figure 3B:
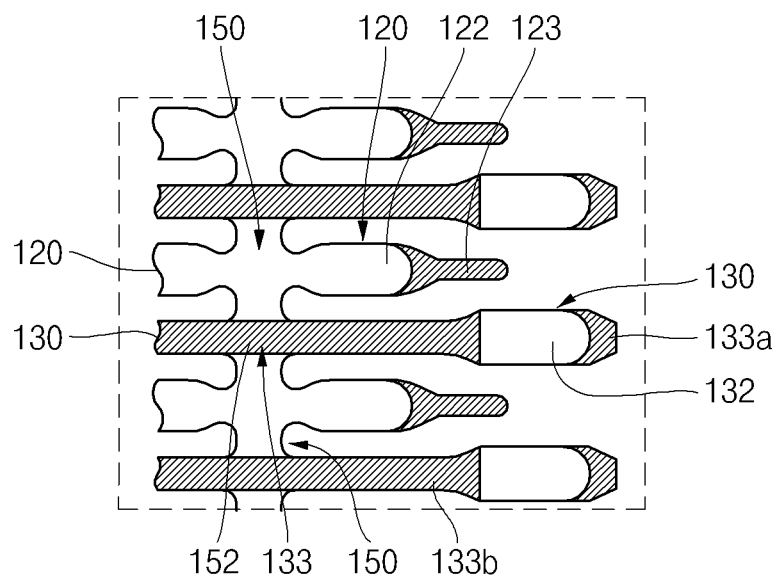
FIG. 3B is an enlargement of the region 3B shown in FIG. 1B.

As is best seen in FIGS. 2A, 3A and 3B, each of the first leads 120 is not of uniform thickness. Rather, each of the first leads 120 is partially etched to include a bottom etched surface 123 which is disposed in opposed relation to the top surface 121, but is recessed relative to the bottom surface 122. As is seen in FIG. 3B, the bottom etched surface 123 extends to the distal end of the corresponding first lead 120 which is disposed closest to the corresponding peripheral edge segment of the die pad 110. In FIG. 3B, the bottom etched surface 123 of each first lead 120 is indicated by the condensed hatching which slopes downwardly from right to left. As will be recognized, the thickness of each first lead 120 between the top and bottom surfaces 121, 122 exceeds the thickness between the top surface 121 and the bottom etched surface 123.

In addition to the bottom etched surface 123, each first lead 120 is partially etched to include a top etched surface 125 which is disposed in opposed relation to the bottom surface 122, and is recessed relative to the top surface 121. In addition to being recessed relative to the top surface 121, the top etched surface 125 of each first lead 120 extends from the top surface 121 to a corresponding peripheral segment of the dambar 150. The thickness of each first lead 120 between the top and bottom surfaces 121, 122 also exceeds the thickness between the bottom surface 122 and the top etched surface 125. In FIG. 3A, the top etched surface 125 of each first lead 120 is indicated by cross hatching. As is most apparent from FIG. 2A, the top and bottom surfaces 121, 122 of each first lead 120 extend in substantially coplanar relation to respective ones of the top and bottom surfaces 111, 112 of the die pad 110. Further, the bottom and top etched surfaces 123, 125 of each first lead 120 extend in substantially coplanar relation to each other and to the etched surface 113 of the die pad 110. Those of ordinary skill in the art will recognize that the number of first leads 120 included in each set thereof may vary from that shown. In FIGS. 1A and 1B without departing from the spirit and scope of the present invention.

In FIGS. 1A and 1B, the leadframe 100 is shown in its unsingulated state as positioned within a matrix of interconnected leadframes 100. In this regard, each first lead 120 of that leadframe 100 shown in its entirety in FIGS. 1A and 1B extends in opposed relation to a corresponding, identically configured first lead 120 of an adjacent leadframe 100. As such, each peripheral segment of the dambar 150 shown in FIGS. 1A and 1B includes two sets of first leads 120 extending generally perpendicularly from each of the opposite sides thereof. Stated another way, for each peripheral segment of the dambar 150 shown in FIGS. 1A and 1B, a corresponding set of the first leads 120 of that leadframe 100 shown in its entirety extends generally perpendicularly from one side thereof, with one set of the first leads 120 of an adjacent leadframe 100 extending generally perpendicularly from the opposite side thereof in opposed relation to respective ones of the first leads 120 of the remaining set.

As best seen in FIG. 3A, each peripheral segment of the dambar 150 is provided with multiple top etched regions 151 which extend between or "bridge" the etched top surfaces 125 of respective ones of each of the opposed pairs of first leads 120 in the interconnected leadframes 100. As best seen in FIG. 2A, the etched top surfaces 125 of each opposed pair of the first leads 120 protruding from a common peripheral segment of the depicted dambar 150, and the corresponding intervening top etched region 151 of the dambar 150, extend in generally coplanar relation to each other.

The leadframe 100 further comprises a plurality of second leads 130. Like the first leads 120, the second leads 130 are preferably segregated into four (4) sets, with each set of the second leads 130 extending generally perpendicularly from a corresponding one of the peripheral segments of the dambar 150 toward a respective one of the peripheral edge segments of the die pad 110. Each of the second leads 130 is sized such that the inner, distal end thereof is spaced a predetermined distance from the corresponding peripheral edge segment of the die pad 110. From the perspectives shown in FIGS. 1A and 1B, each of the second leads 130 includes a generally planar first or top surface 131 and an opposed, generally planar second or bottom surface 132.

As is best seen in FIGS. 2A, 3A and 3B, each of the second leads 130 is not of uniform thickness. Rather, each of the second leads 130 is partially etched to include a bottom etched surface 133 which is disposed in opposed relation to the top surface 131, but is recessed relative to the bottom surface 132. As best seen in FIG. 3B, the bottom etched surface 133 is segregated by the bottom surface 132 into a first segment 133a which extends to the distal end of the corresponding second lead 130 which is disposed closest to the corresponding peripheral edge segment of the die pad 110, and a second segment 133b which extends between the bottom surface 132 and a corresponding peripheral segment of the dambar 150. In FIG. 3B, the first and second segments 133a, 133b of the bottom etched surface 133 of each second inner lead 130 are each indicated by the condensed hatching which slopes downwardly from right to left. As will be recognized, the thickness of each second inner lead 130 between the top and bottom surfaces 131, 132 exceeds the thickness between the top surface 131 each of the first and second segments 133a, 133b of the bottom etched surface 133.

As is most apparent from FIG. 2B, the top and bottom surfaces 131, 132 of each second inner lead 130 extend in substantially coplanar relation to respective ones of the top and bottom surfaces 111, 112 of the die pad 110. Further, the first and second segments 133a, 133b of the bottom etched surface 133 of each second inner lead 130 each extend in substantially coplanar relation to the etched surface 113 of the die pad 110, and to the bottom and top etched surfaces 123, 125 of the first leads 120. Those of ordinary skill in the art will recognize that the number of second inner leads 130 included in each set thereof may vary from that shown. In FIGS. 1A and 1B without departing from the spirit and scope of the present invention.

As indicated above, in FIGS. 1A and 1B, the leadframe 100 is shown in its unsingulated state as positioned within a matrix of interconnected leadframes 100. In this regard, each second lead 130 of that leadframe 100 shown in its entirety in FIGS. 1A and 1B extends in opposed relation to a corresponding, identically configured second lead 130 of an adjacent leadframe 100. As such, each peripheral segment of the dambar 150 shown in FIGS. 1A and 1B includes two sets of second leads 130 extending generally perpendicularly from each of the opposite sides thereof. Stated another way, for each peripheral segment of the dambar 150 shown in FIGS. 1A and 1B, a corresponding set of the second leads 130 of that leadframe 100 shown in its entirety extends generally perpendicularly from one side thereof, with one set of the second leads 130 of an adjacent leadframe 100 extending generally perpendicularly from the opposite side thereof in opposed relation to respective ones of the second leads 130 of the remaining set.

Figure 2C:
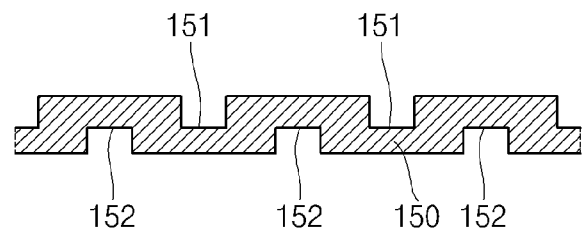
FIG. 2C is a cross-sectional view of the leadframe taken along line 2C-2C of FIG. 1A.
Figure 2D:
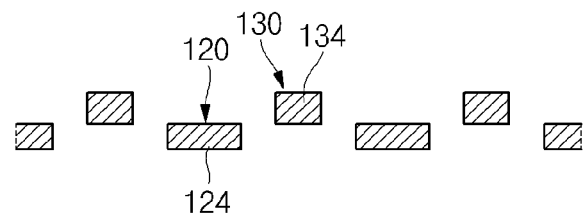
FIG. 2D is a cross-sectional view of the leadframe taken along line 2D-2D of FIG. 1A.

As best seen in FIG. 3B, each peripheral segment of the dambar 150 is provided with multiple bottom etched regions 152 which extend between or "bridge" the second segments 133b of the etched bottom surfaces 133 of respective ones of each of the opposed pairs of second leads 130 in the interconnected leadframes 100. As best seen in FIG. 2B, the second segments 133b of the etched bottom surfaces 133 of each opposed pair of the second leads 130 protruding from a common peripheral segment of the depicted dambar 150, and the corresponding intervening bottom etched region 152 of the dambar 150, extend in generally coplanar relation to each other. Further, as seen in FIG. 2C, the etched top and bottom etched regions 151, 152 of the dambar 150 extend in generally coplanar relation to each other, and thus in generally coplanar relation to the bottom and top and bottom etched surfaces 123, 125 of the first leads 120, as well as the first and second segments 133a, 133b of the bottom etched surfaces 133 of the second leads 130.

In a fabrication process for the semiconductor device 200 which will be described in more detail below, the dambar 150 is singulated or removed from the leadframe 100 to electrically isolate other structural features of the leadframe 100 from each other. Additionally, during such fabrication process for the semiconductor device 200 including the leadframe 100, the encapsulant material used to form the package body of the semiconductor device 200 is able to flow over the bottom and top and bottom etched surfaces 123, 125 of the first leads 120, as well as the first and second segments 133a, 133b of the bottom etched surfaces 133 of the second leads 130, thus resulting in substantial portions of the first and second leads 120, 130 being encapsulated by the package body of the semiconductor device 200 which enhances the bonding or mechanical interlock therebetween.

The leadframe 100 may be fabricated from a conventional metal material, such as copper, copper alloy, steel plated with copper, or a functional equivalent. However, those of ordinary skill in the art will recognize that the present invention is not limited to any particular material for the leadframe 100. Additionally, as indicated above, the number of first and second leads 120, 130 shown in FIGS. 1A and 1B is for illustrative purposes only, and may be modified according to application field. Additionally, though the first and second leads 120, 130 are each shown as being segregated into four sets, it will be recognized that fewer sets thereof may be provided, and may be arranged along any combination of two or three of the peripheral sides of the die pad 110. Moreover, less than four tie bars 114 may be included in the leadframe 100, extending to respective corners of the die pad 110 in any combination.

In the leadframe 100, it is contemplated that the bottom and top and bottom etched surfaces 123, 125 of the first leads 120, the first and second segments 133a, 133b of the bottom etched surfaces 133 of the second leads 130, and the etched top and bottom etched regions 151, 152 of the dambar 150, may be formed to a depth in the range of from about ten percent (10%) to about ninety percent (90%) of the total thickness of the leadframe 100. Importantly, the formation of the top etched surfaces 125 of the first leads 120, and the second segments 133b of the bottom etched surfaces 133 of the second leads 130 to a depth of less than approximately ten percent (10%) of the total thickness of the leadframe 100 could result in the formation of burrs during a sawing process described below. Such burr formation could in turn result in certain adjacent pairs of first and second leads 120, 130 electrically shorting to each other. Conversely, the formation of the bottom etched surfaces 125 of the first leads 120 and the second segments 133b of the bottom etched surfaces 133 of the second leads 130 to a depth greater than approximately 90% of the total thickness of the leadframe 100 could result in premature separation of the first or second leads 120, 130 from the dambar 150 during the manufacturing process for the semiconductor device 200.

Referring now to FIGS. 4A and 4B, the semiconductor device or package 200 as fabricated to include the leadframe 100 is shown in detail. As will be recognized by those of ordinary skill in the art, in the completed semiconductor device 200 shown in FIGS. 4A and 4B, the dambar 150 is singulated or removed from the leadframe 100 to facilitate the electrical isolation of the various structural features of the leadframe 100 from each other. More particularly, the dambar 150 is singulated in a manner wherein the first and leads 120, 130 are electrically isolated from each other, and from the die pad 110 and tie bars 114 as well.

In the semiconductor device 200, a semiconductor die 210 is attached to the top surface 111 of the die pad 110 through the use of an adhesive layer. The semiconductor die 210 includes a plurality of terminals or bond pads 211 which are disposed on the top surface thereof opposite the bottom surface adhered to the adhesive layer. The bond pads 211 are used to deliver and receive electrical signals.

The semiconductor device 200 further comprises a plurality of conductive wires 221 which are used to electrically connect the bond pads 211 of the semiconductor die 210 to respective ones of the first and second leads 120, 130. More particularly, as seen in FIGS. 4A and 4B, the wires 221 are extended to the top surfaces 121, 131 of respective ones of the first and second leads 120, 130. The conductive wires 221 may be fabricated from aluminum, copper, gold, silver, or a functional equivalent. However, those of ordinary skill in the art will recognize that the present invention is not limited to any particular material for the wires 221. One or more conductive wires 221 may also be used to electrically connect one or more bond pads of the semiconductor die 210 directly to the die pad 110.

In the semiconductor device 200, the die pad 110, the tie bars 114, the first and second leads 120, 130, the semiconductor die 210, and the conductive wires 221 are at least partially encapsulated or covered by an encapsulant material which, upon hardening, forms a package body 230 of the semiconductor device 200. More particularly, the package body 230 covers the entirety of the die pad 110 except for the bottom surface thereof which is circumvented by the etched surface 113. The package body 230 also covers the top surfaces 121, 131 of the first and second leads 120, 130, the bottom and top etched surfaces 123, 125 of the first leads 120, and the first and second segments 133a, 133b of the bottom etched surfaces 133 of the second leads 130. The package body 230 further covers the top and etched bottom surfaces of the tie bars 114. However, the package body 230 does not cover the bottom surfaces 122, 132 of the first and second leads 120, 130. The flow of the encapsulant material over the etched surface 113, the bottom etched surfaces 123, and the first and second segments 133a, 133b of the bottom etched surfaces 133 facilitates a firm mechanical interlock between the package body 230, the die pad 110, and the first and second leads 120, 130.

As indicated above, though the package body 230 covers the etched surface 113 of the die pad 110, it does not cover the bottom surface 112 thereof. Thus, as is apparent from FIG. 7D, the bottom surface 112 of the die pad 110 and the bottom surfaces 122, 132 of the first and second leads 120, 130 are exposed in a common exterior surface of the package body 230 which, as viewed from the perspective shown in FIGS. 4A and 4B, is the bottom surface 231 thereof. As is also shown in FIG. 7D, the varying lengths of the first and second leads 120, 130 results in the bottom surfaces 122, 132 thereof which are exposed in the bottom surface 231 of the package body 230 being staggered or offset relative to each other, rather than being linearly aligned with each other. The bottom surfaces 122, 132 of the first and second leads 120, 130 may extend in substantially flush or coplanar relation to the bottom surface 231 of the package body 230, or may protrude slightly therefrom as is apparent from FIGS. 5A and 5B. As a result of their exposure in the bottom surface 231, the first and second leads 120, 130 are capable of being mounted to the surface of an underlying substrate such as a printed circuit board through the use of, for example, a soldering technique. Electrical signals are routed between the first and second leads 120, 130 and the semiconductor die 210 by the corresponding conductive wires 221.

During the process of fabricating the semiconductor device 200 as will be described in more detail below, the package body 230 is a portion of a single, unitary mold cap 240 which covers a plurality of interconnected leadframes 100 within a matrix. In this regard, it is only when such mold cap 240 and portions of the leadframes 100 covered thereby are subjected to a saw singulation process that discrete semiconductor devices 200 are fabricated having the structural features described above. For the interconnected leadframes 100 in the matrix, each dambar 150 is partially covered by the encapsulant material used to form such mold cap 240 and ultimately the individual package bodies 230 singulated therefrom. More particularly, as is best seen in FIG. 7C, the encapsulant material used to form the mold cap 240 covers the entirety of the top surface of each dambar 150, including the top etched regions 151 formed therein. However, the bottom surface of each dambar 150 is, for the most part, not covered by the mold cap 240. Rather, as seen in FIG. 7C, only the bottom etched regions 152 within each dambar 150 are covered by the mold cap 240.

As will also be described in more detail below, the dambar 150 separating adjacent interconnected leadframes 100 in the matrix from each other is ultimately removed or singulated by the completion of a sawing process which concurrently segregates the mold cap 240 into the individual package bodies 230 of the discrete semiconductor devices 200. As seen in FIGS. 4A, 4B and 5A, 5B, each completed package body 230 formed as a result of the aforementioned saw singulation process defines a side surface 232 which extends generally perpendicularly relative to the bottom surface 231. The removal of the dambar 150 by such saw singulation process, in addition to facilitating the electrical isolation of the first and second leads 120, 130 of each individual leadframe 100 from each other, further results in each of the first leads 120 defining a generally planar outer end 124 which is exposed in the side surface 232 of a corresponding package body 230, and each of the second leads 130 also defining a generally planar outer end 134 exposed in such side surface 232 as well. As seen in FIGS. 4A and 4B, the outer ends 124, 134 of the first and second leads 120, 130 are substantially flush or coplanar with the side surface 232 of the package body 230.

Figure 5A:
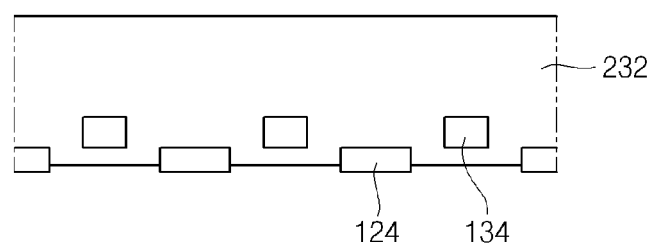
FIGS. 5A and 5B are partial side-elevational views of the semiconductor device shown in FIGS. 4A and 4B.
Figure 5B:
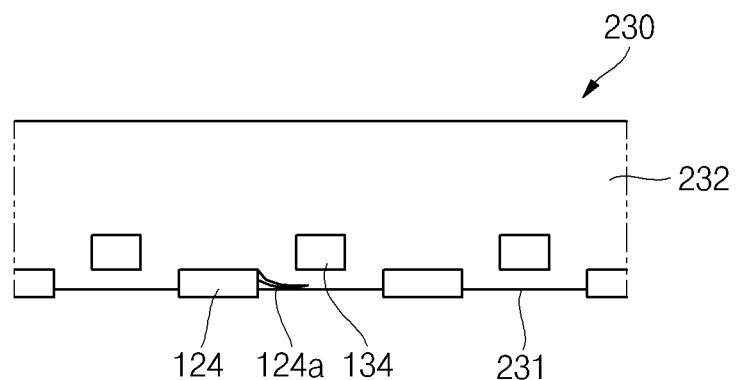

As is apparent from FIGS. 5A and 5B, the outer ends 124, 134 of the first and second leads 120, 130 within the semiconductor device 200 are of differing shapes and hence areas, with the area of the outer end 124 of each first lead 120 exceeding that of the outer end 134 of each second lead 130. Additionally, the outer ends 134 of the second leads 130 are oriented above or elevated relative to the outer ends 124 of the first leads 120. Typically, when the first and second leads 120, 130 of each leadframe 100 are severed from the corresponding dambar 150, the quantity of burrs formed in the sawing process is proportional to the cross-sectional area of the first and second leads 120, 130. Since the cross-sectional area of that portion of each first lead 120 which, when severed, defines the outer end 124 is larger than the cross-sectional area of that portion of each second lead 130 which, when severed, defines the outer end 134, the probability of forming burrs on the outer ends 124 of the first leads 120 is greater than the probability of forming burrs on the outer ends 134 of the second leads 130. However, despite the increased risk of burr formation on the first leads 120, as a result of the outer ends 124 of such first leads 120 being positioned lower than the outer ends 134 of the second leads 130, the probability of any such burrs formed on the outer ends 124 being electrically shorted to the outer ends 134 is substantially reduced in the semiconductor device 200. In FIG. 5B, an exemplary burr 124a is shown as extending from the outer end 124 of one first lead 120. However, as is apparent from FIG. 5B, contact between such burr 124a and the outer end 134 of the adjacent second lead 130 as could otherwise cause a shorting therebetween being avoided by the elevation of the outer ends 134 relative to the outer ends 124.

Figure 6:
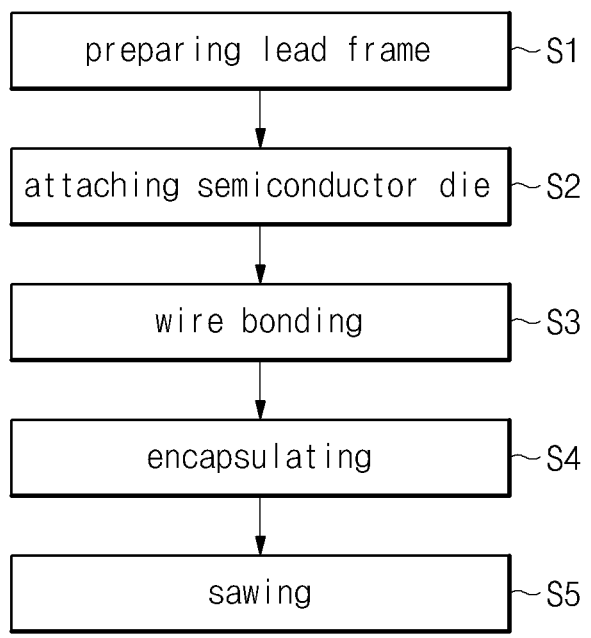
FIG. 6 is a flow chart illustrating an exemplary fabrication method for the semiconductor device shown in FIGS. 4A and 4B.

Referring now to FIG. 6, there is provided a flow chart which sets forth an exemplary method for fabricating the semiconductor device 200 of the present invention. The method comprises the steps of preparing the leadframe (S1), semiconductor die attachment (S2), wire bonding (S3), encapsulation (S4), and sawing (S5). FIGS. 7A-7D provide illustrations corresponding to these particular steps, as will be discussed in more detail below.

Figure 7A:
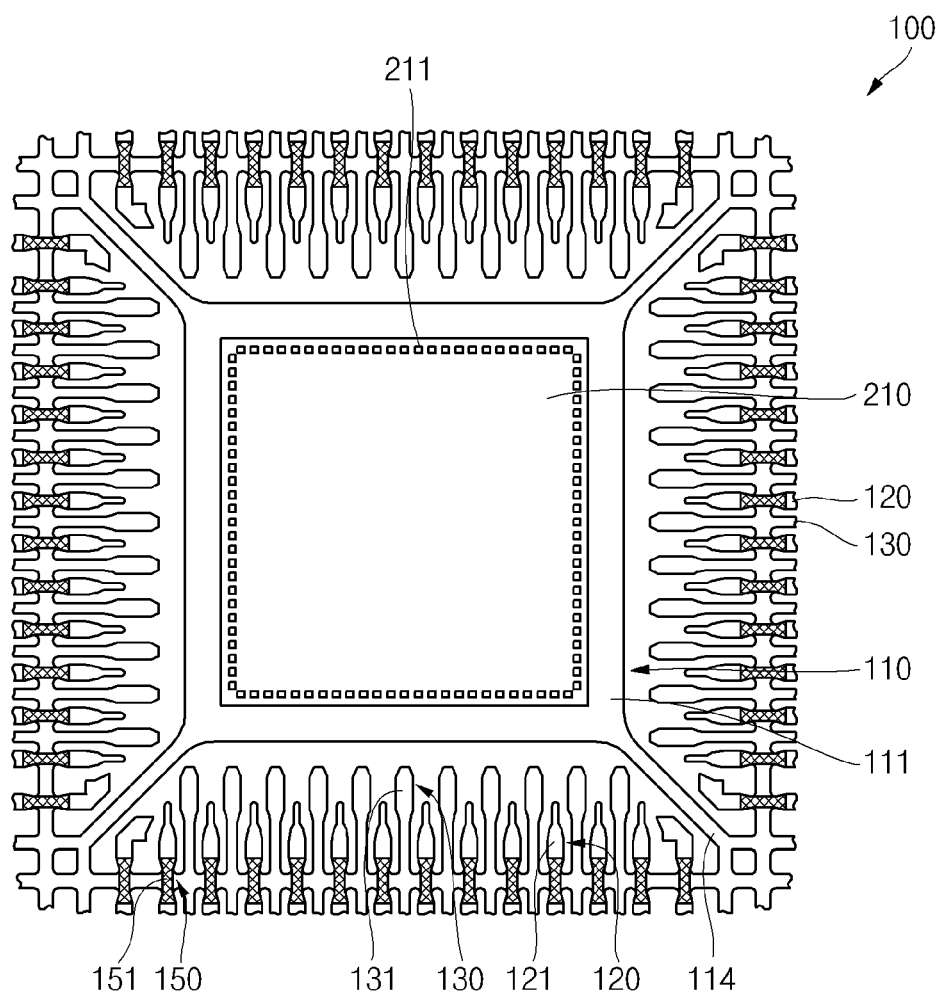
FIGS. 7A-7D are views illustrating an exemplary fabrication method for the semiconductor device shown in FIGS. 4A and 4B.

Referring now to FIG. 7A, in the initial step S1 of the fabrication process for the semiconductor device 200, the leadframe 100 having the above-described structural attributes is provided. Thereafter, step S2 is completed wherein the semiconductor die 210 having the bond pads 211 is attached to the top surface of the die pad 110 of the leadframe 100 through the use of the adhesive layer. The adhesive layer can be selected from well known liquid epoxy adhesives, adhesive films and adhesive tapes, as well as equivalents thereto.

Figure 7B:
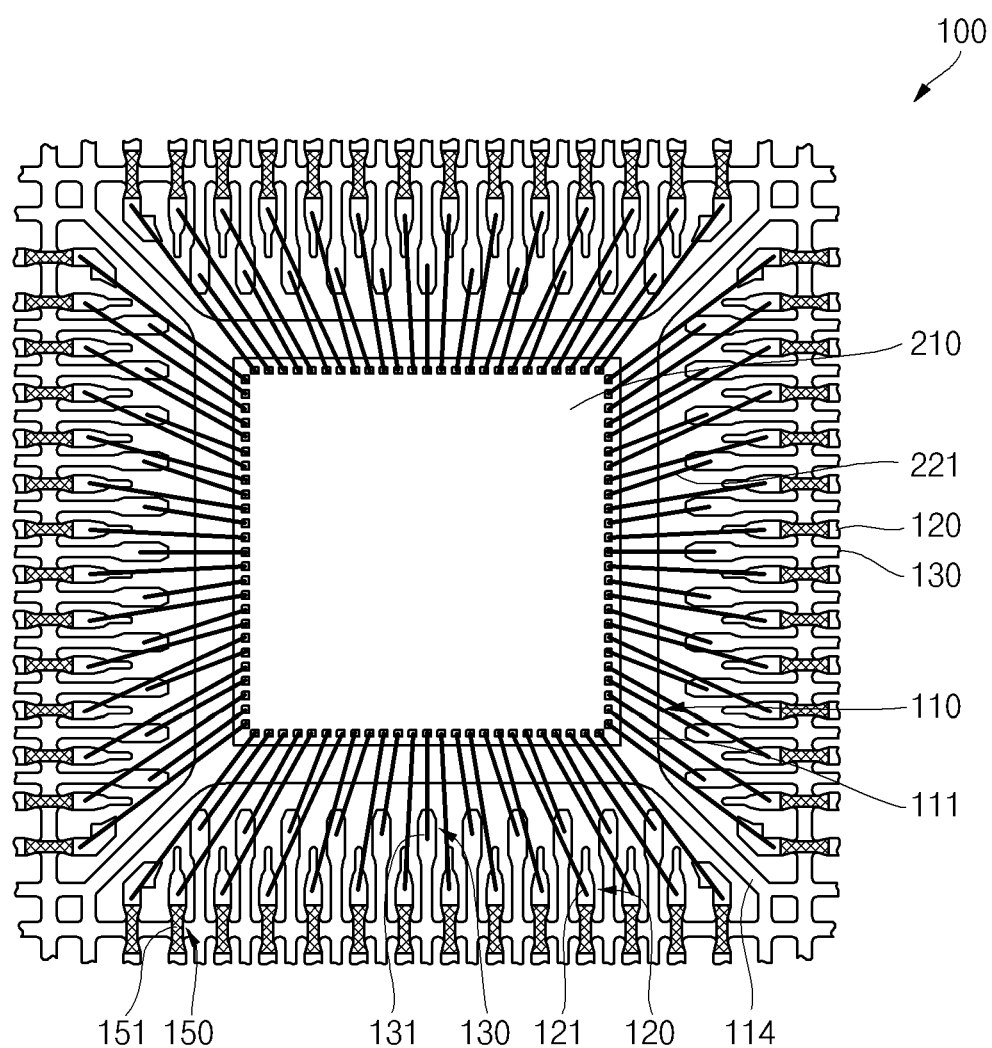
Figure 7C:
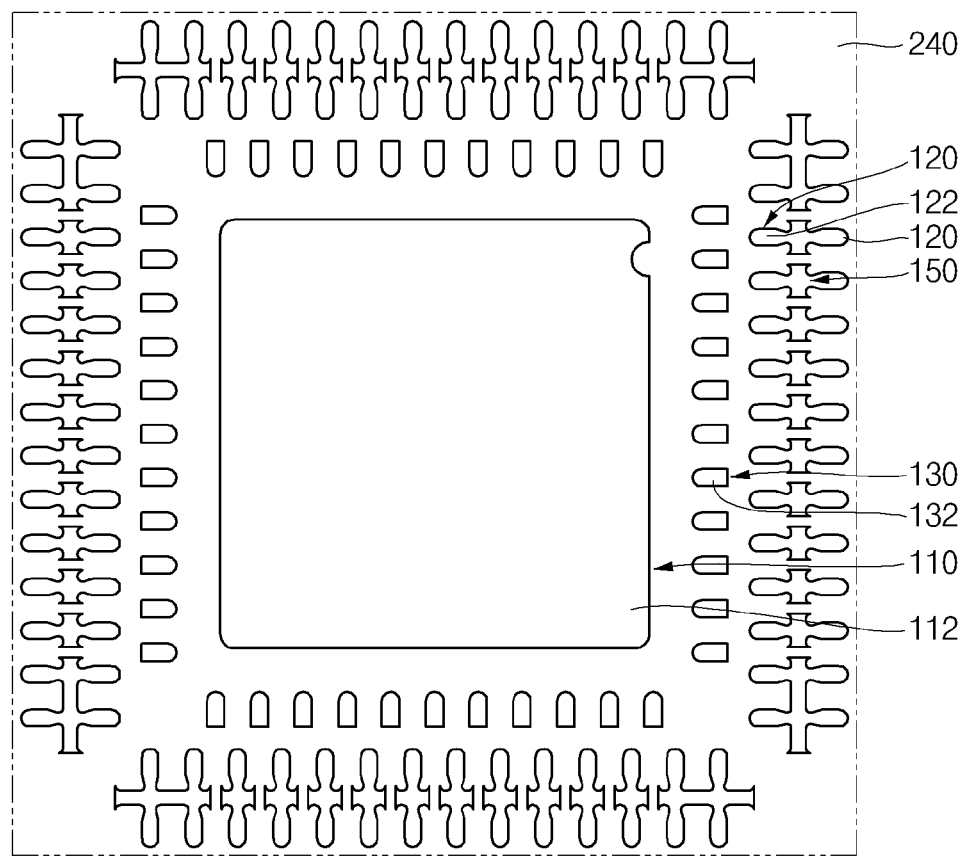
Figure 7D:
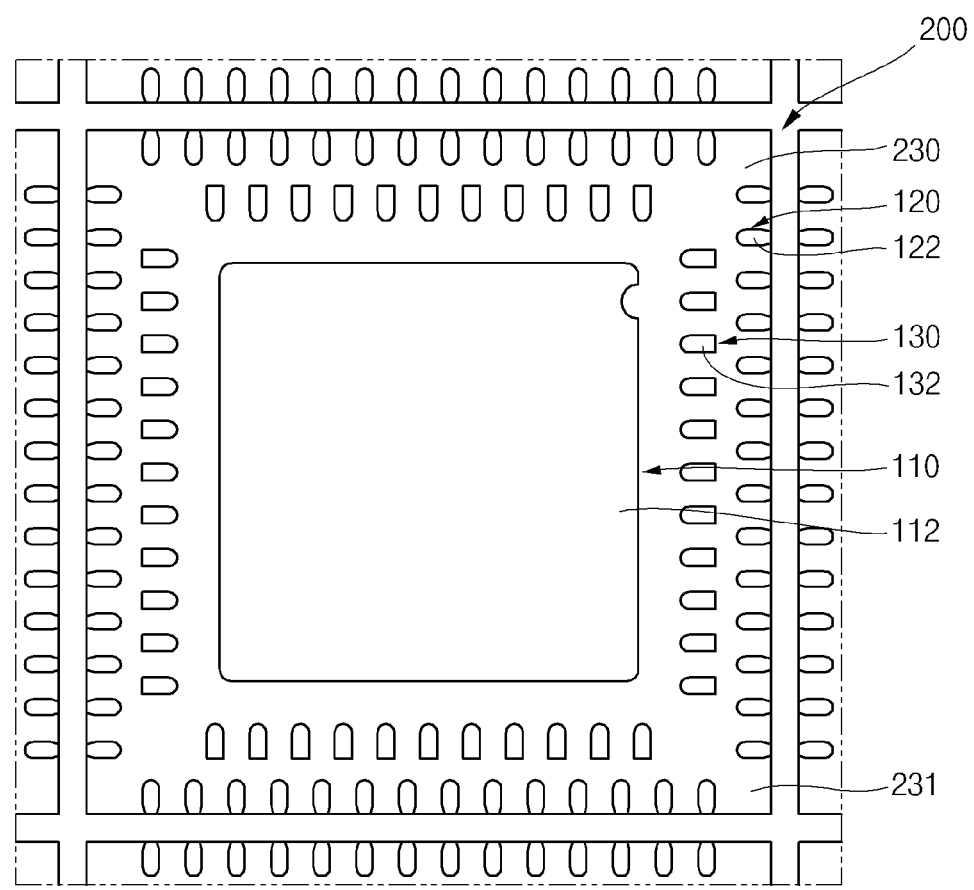

Referring now to FIG. 7B, in the next step S3 of the fabrication process, the conductive wires 221 are used to electrically interconnect the semiconductor die 210 to the leadframe 100 in the aforementioned manner. Specifically, the bond pads 211 of the semiconductor die 210 are electrically connected to the top surfaces 121, 131 of the first and second leads 120, 130. Though not shown, as indicated above, one or more conductive wires 221 may also be used to electrically connect one or more bond pads 211 of the semiconductor die 210 directly to the die pad 110, allowing for the use of the die pad 110 as a ground region.

Referring now to FIG. 7C, in the next step S4 of the fabrication process for the semiconductor device 200, portions of the leadframe 100, the semiconductor die 210 and the conductive wires 221 are encapsulated with an encapsulant material which, upon hardening, forms the package body 230 of the semiconductor device 200. As indicated above, the package body 230 covers the entirety of the die pad 110 except for the bottom surface thereof which is circumvented by the etched surface 113. The package body 230 also covers the top surfaces 121, 131 of the first and second leads 120, 130, the bottom and top etched surfaces 123, 125 of the first leads 120, and the first and second segments 133a, 133b of the bottom etched surfaces 133 of the second leads 130. The package body 230 further covers the top and etched bottom surfaces of the tie bars 114. However, the package body 230 does not cover the bottom surfaces 122, 132 of the first and second leads 120, 130. Thus, the bottom surface 112 of the die pad 110 and the bottom surfaces 122, 132 of the first and second leads 120, 130 are exposed in the bottom surface 231 of the package body 230.

As also indicated above, during the process of fabricating the semiconductor device 200, the package body 230 is a portion of the single, unitary mold cap 240 which covers a plurality of interconnected leadframes 100 within a matrix. For the interconnected leadframes 100 in the matrix, each dambar 150 is partially covered by the encapsulant material used to form such mold cap 240 and ultimately the individual package bodies 230 singulated therefrom. As is seen in FIG. 7C, the encapsulant material used to form the mold cap 240 covers the entirety of the top surface of each dambar 150, including the top etched regions 151 formed therein. However, the bottom surface of each dambar 150 is, for the most part, not covered by the mold cap 240. Rather, only the bottom etched regions 152 within each dambar 150 are covered by the mold cap 240.

Referring now to FIG. 7D, in the next step S5 of the fabrication process for the semiconductor device 200, a sawing process using a diamond blade rotating at a high speed is used to facilitate the removal of the dambars 150 from between the interconnected leadframes 100 in the matrix, and further to concurrently segregate the mold cap 240 into the separate package bodies 230. As indicated above, the removal of the dambar from each leadframe 100 is needed to facilitate the electrical isolation of the first and second leads 120, 130 thereof from each other, as well as from the die pad 110 and tie bars 114.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device, comprising:
a generally planar die pad defining multiple peripheral edge segments;
a plurality of first leads segregated into at least two sets that extend along respective ones of at least two peripheral edge segments of the die pad in spaced relation thereto, wherein the first leads include a first segment having a recessed bottom surface that extends to a distal end proximate to a corresponding peripheral edge segment of the die pad, a second segment having a recessed top surface that extends to a corresponding edge of the semiconductor device, and a third segment between the first and second segments of the first leads, wherein the third segments of the first leads have a thickness, and wherein the second segments of the first leads are recessed to a depth from 10% to 90% of the thickness of the third segments of the first leads;
a plurality of second leads segregated into at least two sets that extend along respective ones of at least two peripheral edge segments of the die pad in spaced relation thereto, wherein the second leads includes a first segment having a recessed bottom surface that extends to a distal end proximate to a corresponding peripheral edge segment of the die pad, a second segment having a recessed bottom surface that extends to a corresponding edge of the semiconductor device, and a third segment between the first and second segments of the second leads, wherein the third segments of the second leads have a thickness, and wherein the second segments of the second leads are recessed to a depth from 10% to 90% of the thickness of the third segments of the second leads, and wherein the third segments of the plurality of second leads have sidewalls that are substantially devoid of recessed surfaces to maximize contact area;
a semiconductor die attached to the die pad and electrically connected to at least some of the first and second leads; and
a package body defining generally planar bottom and side surfaces, the package body at least partially encapsulating the first and second leads and the semiconductor die such that at least portions of the first and second leads are exposed in the bottom and side surfaces of the package body and the first segments of the first leads and the first segments of the second leads are encapsulated by the package body;
the first and second leads being configured such that the portions thereof that are exposed in the side surface are arranged at differing relative elevations; and
further comprising at least one tie bar extending from a corner region of the die pad, the at least one tie bar having a recessed bottom surface along its entire length, the recessed bottom surface of the at least one tie bar covered by the package body.

2. The semiconductor device of claim 1 wherein a portion of the die pad is exposed in the bottom surface of the package body, and wherein at least one adjacent pair of first leads is disposed proximate to a corner region of the semiconductor device, and wherein the first segments of the pair of first leads have different shapes.

3. The semiconductor device of claim 1 wherein the die pad has a generally quadrangular configuration, and the first and second leads are segregated into at least four sets which each extend along a respective one of the peripheral edge segments of the die pad.

4. The semiconductor device of claim 3 wherein those portions of the second leads which are exposed in the bottom surface of the package body are generally concentrically positioned between the die pad and those portions of the first leads which are exposed in the bottom surface of the package body.

5. The semiconductor device of claim 4 wherein those portions of the second leads of each set which are exposed in the bottom surface of the package body are offset relative to those portions of the first leads of a corresponding set which are exposed in the bottom surface of the package body.

6. The semiconductor device of claim 1 wherein:
each of the first leads defines a generally rectangular outer end which is exposed in the side surface of the package body; and
each of the second leads defines a generally rectangular outer end which is exposed in the side surface of the package body.

7. The semiconductor device of claim 6 wherein:
the outer end of each of the first leads is of a first area; and
the outer end of each of the second leads is of a second area which is less than the first area.

8. The semiconductor device of claim 6 wherein:
the outer end of each of the first leads defines at least four peripheral edge segments;
the outer end of each of the second leads defines at least four peripheral edge segments; and
one of the peripheral edge segments of each the first leads extends in generally coplanar relation to one of the peripheral edge segments of each of the second leads.

9. The semiconductor device of claim 6 wherein:
the package body extends along each of the at least four peripheral edge segments defined by the outer end of each of the second leads; and
the package body extends along only three of the at least four peripheral edge segments defined by the outer end of each of the first leads.

10. A semiconductor device, comprising:
a die pad;
a plurality of first leads that extend at least partially about the die pad in spaced relation thereto, wherein each first lead includes a first segment having a bottom etched surface that extends to a distal end proximate to a peripheral edge segment of the die pad, a second segment having a recessed top surface that extends to a corresponding edge of the semiconductor device, and a third segment between the first and second segments of the first leads, wherein the third segments of the first leads have a thickness, and wherein the second segments of the first leads are recessed to a depth from about 10% to about 90% of the thickness of the third segments of the first leads;
a plurality of second leads that extend at least partially about the die pad in spaced relation thereto, wherein each second lead includes a first segment having a bottom etched surface that extends to a distal end proximate to a peripheral edge segment of the die pad, a second segment having a recessed bottom surface that extends to a corresponding edge of the semiconductor device, and a third segment between the first and second segments of the second leads, wherein the third segments of the second leads have a thickness, and wherein the second segments of the second leads are recessed to a depth from about 10% to about 90% of the thickness of the third segments of the second leads, and wherein the third segments of the plurality of second leads have sidewalls that are substantially devoid of recessed surfaces;

a semiconductor die attached to the die pad and electrically connected to at least some of the first and second leads; and a package body defining a side surface, the package body at least partially encapsulating the first and second leads and the semiconductor die such that at least portions of the first and second leads are exposed in the side surface of the package body, and wherein the package body completely encapsulates the first segment of each first lead and the first segment of each second lead;

the first and second leads being configured such that the portions thereof which are exposed in the side surface are arranged at differing relative elevations; and wherein a portion of the die pad is exposed in the package body, and wherein at least one adjacent pair of first leads is disposed proximate to a corner region of the semiconductor device, and wherein the first segments of the pair of first leads have different shapes.

11. The semiconductor device of claim 10 wherein:
each of the first leads defines a generally rectangular outer end which is exposed in the side surface of the package body; and
each of the second leads defines a generally rectangular outer end which is exposed in the side surface of the package body.

12. The semiconductor device of claim 11 wherein:
the outer end of each of the first leads is of a first area; and
the outer end of each of the second leads is of a second area which is less than the first area.

13. The semiconductor device of claim 11 wherein:
the outer end of each of the first leads defines at least four peripheral edge segments;
the outer end of each of the second leads defines at least four peripheral edge segments; and
one of the peripheral edge segments of each the first leads extends in generally coplanar relation to one of the peripheral edge segments of each of the second leads.

14. The semiconductor device of claim 11 wherein:
the package body extends along each of the at least four peripheral edge segments defined by the outer end of each of the second leads; and
the package body extends along only three of the at least four peripheral edge segments defined by the outer end of each of the first leads.

15. The semiconductor device of claim 10 wherein the semiconductor die is electrically connected to at least some of the first and second leads by conductive wires which are covered by the package body, and wherein the semiconductor device further comprises at least one tie bar extending from a corner region of the die pad, the at least one tie bar having a bottom etched surface along its entire length, the bottom etched surface of the at least one tie bar encapsulated by the package body.

16. A semiconductor device, comprising:
a die pad;
a plurality of first leads that extend at least partially about the die pad in spaced relation thereto, wherein each first lead includes a first segment having a bottom etched surface that extends to a distal end proximate to a corresponding peripheral edge segment of the die pad, a second segment having a top etched surface that extends to a corresponding edge of the semiconductor device, and a third segment between the first and second segments of each first lead, and wherein the second segment of each first lead is etched to a depth between about 10% to about 90% of the thickness of the third segment of each first lead, and wherein at least one adjacent pair of first leads is disposed proximate to a corner region of the semiconductor device, and wherein the first segments of the at least one adjacent pair of first leads have different shapes;

a plurality of second leads that extend at least partially about the die pad in spaced relation thereto, wherein each second lead includes a first segment having a bottom etched surface that extends to a distal end proximate to a corresponding peripheral edge segment of the die pad, a second segment having a bottom etched surface that extends to a corresponding peripheral edge of the semiconductor device and a third segment between the first and second segments of each second lead, the third segment having a thickness, and wherein the second segment of each second lead is etched to a depth between about 10% to about 90% of the thickness of the third segment of each second lead, and wherein the first segments of the second leads are substantially confined to end portions of the third segments of the plurality of second leads to maximize contact area of the third segments;

a semiconductor die attached to the die pad and electrically connected to at least some of the first and second leads; and a package body defining generally planar bottom and side surfaces, the package body at least partially encapsulating the first and second leads and the semiconductor die such that at least portions of the first and second leads are exposed in the bottom and side surfaces of the package body, wherein the package body encapsulates the first segments of each first lead and the first segments of each second lead;

the second segments of the first and second leads being configured such that the portions thereof that are exposed in the side surface are arranged at differing relative elevations.

17. The semiconductor device of claim 16 wherein:
each of the first leads defines a generally rectangular outer end which is exposed in the side surface of the package body and is of a first area; and
each of the second leads defines a generally rectangular outer end which is exposed in the side surface of the package body and is of a second area which is less than the first area.

18. The semiconductor device of claim 17 wherein:
the outer end of each of the first leads defines at least four peripheral edge segments;
the outer end of each of the second leads defines at least four peripheral edge segments;
one of the peripheral edge segments of each the first leads extends in generally coplanar relation to one of the peripheral edge segments of each of the second leads;

the package body extends along each of the at least four peripheral edge segments defined by the outer end of each of the second leads; and the package body extends along only three of the at least four peripheral edge segments defined by the outer end of each of the first leads.

* * * * *